MULTILAYER PRINTED CIRCUIT ASSEMBLIES

Filed Aug. 19, 1964

3 Sheets-Sheet 1

INVENTORS
FREDERICK W. SCHNEBLE, JR.
JOSEPH POLICHETTE
EDWARD J. LEECH

BY

MORGAN, FINNEGAN, DURHAM & PINE

ATTORNEYS

INVENTORS
FREDERICK W. SCHNEBLE, JR.
JOSEPH POLICHETTE
EDWARD J. LEECH
BY
MORGAN, FINNEGAN, DURHAM & PINE
ATTORNEYS

INVENTORS
FREDERICK W. SCHNEBLE, JR.
JOSEPH POLICHETTE
EDWARD J. LEECH
BY
MORGAN, FINNEGAN, DURHAM & PINE
ATTORNEYS

United States Patent Office 3,322,881
Patented May 30, 1967

3,322,881
MULTILAYER PRINTED CIRCUIT ASSEMBLIES

Frederick W. Schneble, Jr., 200 Lexington Ave., Oyster Bay, N.Y. 11771; Joseph Polichette, 9 Hitchcock Lane, South Farmingdale, N.Y. 11735; and Edward J. Leech, Center Island, Oyster Bay, N.Y. 11771
Filed Aug. 19, 1964, Ser. No. 390,646
10 Claims. (Cl. 174—68.5)

This invention relates to printed circuits and more particularly to multilayer printed circuit assemblies and to methods for producing the same.

It is an object of this invention to provide improved multilayer printed circuit assemblies.

Another object of this invention is to provide improved multilayer circuit assemblies which are provided with electrical connections between the layers.

A further object of this invention is to provide procedures for making multilayer printed circuit assemblies whereby lamination of a plurality of separate, individually made circuit boards is eliminated.

Another object of this invention is to provide methods for making multilayer printed circuit board assemblies whereby electrical interconnections between the circuit layers are produced simultaneously with formation of the circuit patterns.

Still a further object of this invention is to provide improved multilayer printed circuit assemblies having electrical interconnections between the layers, the interconnections being provided with apertures for the reception of external electrical component leads.

Other objects of this invention include improved two-sided circuit boards.

Still a further object is to provide improved procedures for making two-sides printed circuit boards with through connections between the two sides of the board, the through connections being provided with apertures for the reception of leads from external circuit components.

Other objects and advantages of this invention will in part be set forth and will in part be obvious herefrom or may be learned by practice with the invention.

Figure 1:
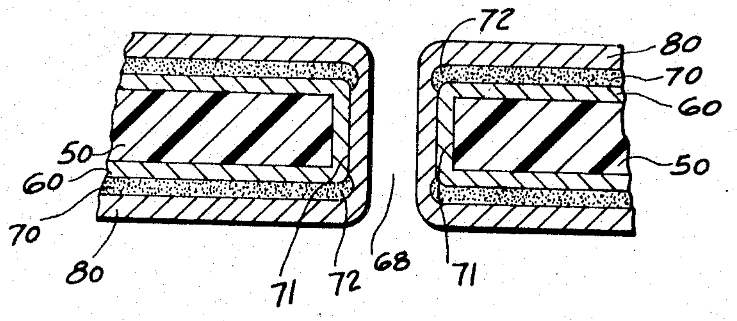
Figure 3:
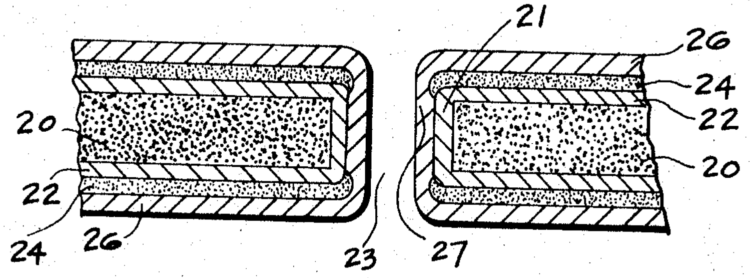
Figure 4:
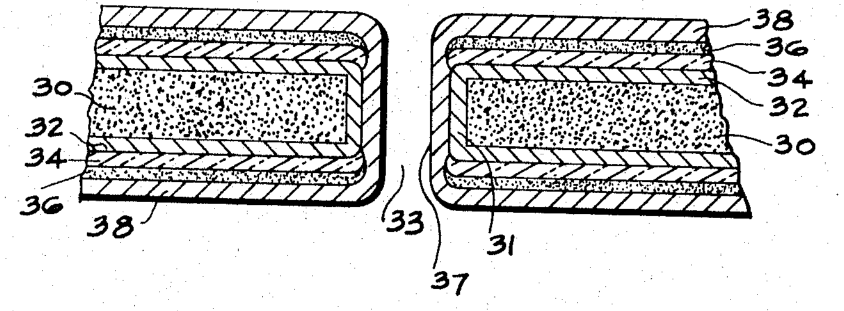
Figure 5:
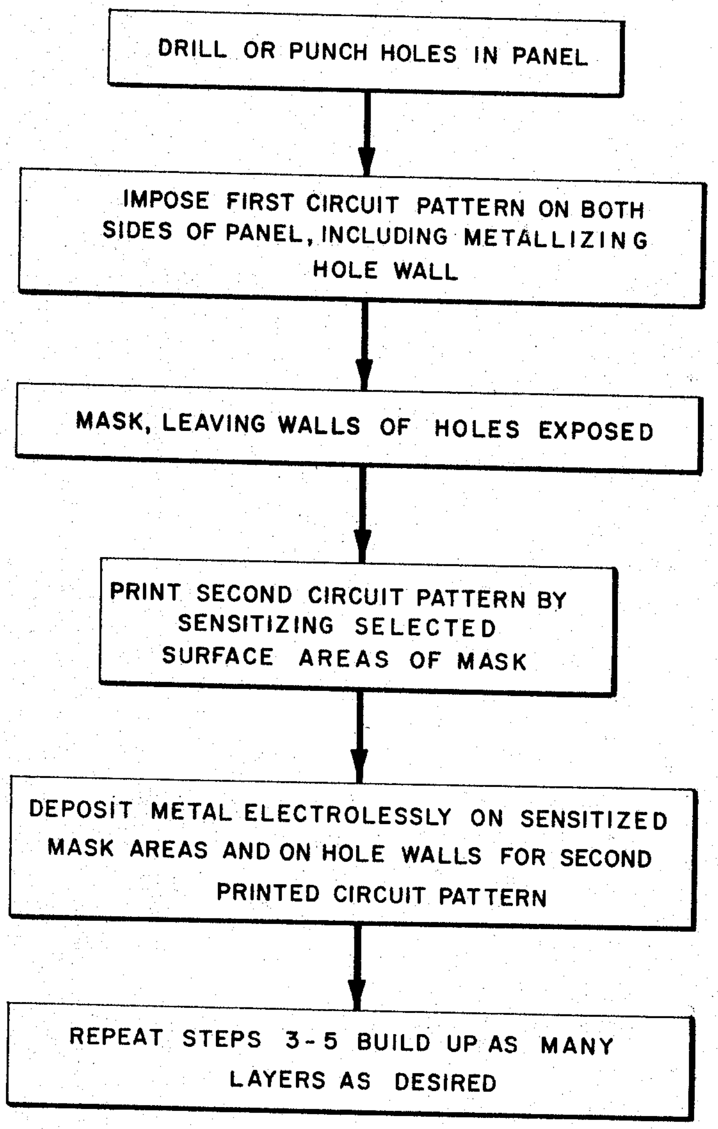

In the accompanying drawings:

FIGURE 1 is a portion of a cross-section of a multilayer printed circuit board produced in accordance with the teachings contained herein;

FIGURE 2A–E illustrates various stages in the production of multilayer circuit assembly in accordance with one embodiment of this invention;

FIGURES 3–4 are fragmented cross-sections of further embodiments of the invention; and FIGURE 5 is a simplified flow sheet of a typical procedure which may be used in making the multilayer circuit assemblies of the invention.

As brought out hereinabove, an important feature of the invention is that multilayer printed circuit boards are produced utilizing a technique which eliminates the need for laminating separate circuit boards. According to this invention, separate circuit layers are sequentially formed on an insulating substratum, and as formed, are isolated one from another by an insulating resinous mask. Simultaneously through connections are made from circuit layer to circuit layer via holes or apertures originally provided in the insulating base.

The circuit pattern may be built up sequentially on one or both sides of the insulating substrata. An advantage of the invention is that circuits may be built up sequentially on both sides of the substratum.

FIGURE 1 illustrates a typical embodiment of the invention. As shown therein, the multilayer printed circuit assembly comprises an insulating substratum 50 having apertures 68 defining cross-overs between the top and bottom surface of the substratum. Superimposed on the top and bottom surface of the substratum and covering the lateral walls surrounding the apertures 68 is a first printed circuit pattern 60. Covering the first circuit pattern 60 is an insulating resinous mask 70. As shown at 72, the insulating mask 70 tapers off gradually into the hole and extends slightly below the top and bottom surface of the panel, thereby leaving the wall surrounding the hole exposed. It will be remembered that this surrounding wall is coated with metal layer 71 which forms a part of the first circuit pattern 60.

Superimposed on the insulating mask 70 is a second circuit pattern 80. Circuit pattern 80 extends into the hole and is superimposed on the metal layer 71 surrounding the aperture 68, thereby forming a connection between the first circuit pattern 60 and the second circuit pattern 80. The aperture 68 remains in the board for reception of leads from external circuit components.

As will readily be appreciated, any desired number of circuit patterns may be built up by repeating the described steps.

The circuit patterns need not be superimposed on both sides of the substratum 50. Thus, embodiments wherein the circuit pattern is built up on only one side of the board is well within the purview of the invention.

The steps in a typical process for making the multilayer assemblies of this invention are illustrated in FIGURE 5 which is a simplified flow sheet.

According to FIGURE 5, the circuit assemblies are formed as follows:

(1) Drill or punch holes in an insulating panel wherein interconnections are desired.

(2) Impose a first circuit pattern on both sides of the panel and metallize the hole wall.

(3) Mask the first circuit pattern leaving the lateral walls surrounding the holes exposed.

(4) Sensitize the areas of the surface of the resinous mask to the reception of electroless metal, said sensitized areas forming a second circuit pattern.

(5) Deposit metal electrolessly on the pattern and simultaneously on the hole walls.

(6) Repeat steps 3–5 to build up as many layers as desired.

The term "catalytic" agent as used herein refers to an agent which is catalytic to the reduction of the metal cations dissolved in electroless metal deposition baths of the type to be described. Such catalytic agents include nickel, cobalt, iron, steel, palladium, platinum, copper, brass, manganese, chromium, molybdenum, tungsten, titanium, tin and silver, including mixtures thereof and certain salts thereof.

Catalytic particles can be added to or formed on the insulating resin mask which separates the circuit layers in a variety of ways. Thus, the resin mask can be contacted with an acidic solution of stannous chloride, washed with water, and then contacted with an acidic solution of a precious metal salt, e.g., palladium chloride. A mono-layer of precious metal salt will thereby be produced on the surface of the insulating resin mask, which mono-layer is catalytic to the reduction of the metal ions in the electroless metal plating solutions.

Alternatively, the mask can be treated with an acidic aqueous solution containing, in combination, stannous tin ions and precious metal ions.

In general, the sensitization procedure involves adhering to the normally non-catalytic surface of the resinous mask, by any means, finely divided particles of metals or metal oxides of the type described which are catalytic to electroless deposition.

The term catalytic surface as used herein refers to a surface composed of or comprising or coated with particles of a catalytic agent.

Preferably, the catalytic particles will be superimposed on the mask in the form of an adhesive resinous ink in which the catalytic agent is dispersed.

Thus, an ink comprising an adhesive resinous material having dispersed therein finely divided particles of a catalytic agent may be adhered directly to the exposed surface of the resinous mask.

Particularly suitable as the catalytic agent for use in manufacturing the multi-circuit assemblies described herein is cuprous oxide and this material is preferred for use. Cuprous oxide is itself an exceptionally good insulator of electricity. Additionally, when reduced, as by treatment with an acid, the cuprous oxide may be changed at least partially to metallic copper, which in turn serves as an exceptionally good catalytic site for deposition of electroless metal, e.g., electroless copper.

The catalytic compositions of the present invention may take a variety of forms.

For example, the insulating masks or base materials contemplated for use are most frequently formed of resinous material. The catalytic active agents disclosed herein, e.g., copper oxide, in finely divided form, may be incorporated into the resin by milling, calendering, or other conventional methods after which the resin is set to form the insulating resinous masks or insulating bases.

Alternatively, a thin film of strip of unpolymerized resin having particles of the active agent suspended therein might be laminated to the resinous mask or base and cured thereon.

In the preferred embodiment, an ink comprising an adhesive resinous material having dispersed therein finely divided particles of the catalytic agent is printed on the surface of the insulating mask or base and cured thereon.

When dispersed in a resinous ink regardless of the manner in which it is incorporated in or on the resinous mask or base material, the catalytic agent is present in a finely divided form and preferably passes 200 mesh, U.S. Standard Sieve Series. Ordinarily from a small fraction of 1% to about 80% of the active agent is admixed with adhesive resinous material to form the catalytic composition, but this concentration will depend to a large extent upon the materials used, and upon the time in which the catalytic compositions are allowed to remain in the electroless plating bath.

The resins into which the catalytic agents are dispersed to form the catalytic compositions such as ink, preferably comprise, in combination, a thermosetting resin and a flexible adhesive resin. Typical of the thermosetting resins may be mentioned oil soluble phenolic type resins, such as fusible copolymers of phenol, resorcinol, a cresol, or a xylenol with an aldehyde or with furfural. As the thermosetting resin may also be mentioned epoxy resins, such as the reaction product of epichlorohydrin with Bisphenol A. Typical of the flexible adhesive resins are the epoxy resins, polyvinyl acetal resins, polyvinyl alcohol, polyvinyl acetate, and the like. Also as the adhesive resin may be mentioned chlorinated rubber and butadiene acrylonitrile copolymers.

The adhesive resins of the type described have appended thereto polar groups, such as nitrile, epoxide, acetal, and hydroxyl groups. Such adhesive resins copolymerize with and plasticize the thermosetting resins, and impart good adhesive characteristics through the action of the polar groups.

The thermosetting resin portion of the composition is required in order to afford resistance to heat upon soldering, and also to protect against decomposition when subjected to the electroless metal bath. A thermosetting resin alone, however, will not ordinarily have adequate tackiness or sufficient flexibility to resist heat shock; and would have negligent resistance to peeling of long conductor patterns from the surface. Admixture of adhesive resins such as those disclosed overcome the deficiencies of the thermosetting resins, and together, the thermosetting and adhesive resins provide an especially suitable composition for carrying the catalytic agents and for adhesively binding them to a base.

Particularly suitable for use as the adhesive resin for certain substrates is a combination of a phenolic type resin and an epoxy resin. The most common epoxy resins for use in the resinous composition are copolymers of epichlorohydrin (1-chloro-2,3-epoxy propane) with Bisphenol A (2,2-p-hydroxy phenyl propane) which have melting points within the range of 20° F. to 375° F. and molecular weights of about 350 to 15,000.

Although epichlorohydrin is the most important organic epoxide employed in the formation of the epoxy resins, other epoxides such as, for example, 1,2,3,4-diepoxy butane may be used. Similarly, epoxy resins derived from phenols other than Bisphenol A are suitable for use. Such resins include, for example, the reaction product of epichlorohydrin with resorcinol, with phenols derived from cashew nut oils, with hydroquinone, with 1,5-dihydroxy naphthalene or with 2,2,5,5-tetrabis-(4-hydroxy phenyl) hexane. Phenolic intermediates of the resol type, hydrazines and sulfonamides, such as, for example, 2,4-toluene disulfonamide, may also be used for reaction with an organic epoxide to produce epoxy resins suitable for use. Aliphatic epoxy resins are also suitable. Such resins are, for example, the reaction product of epichlorohydrin with glycerol, with ethylene glycol or with pentaerythritol.

The phenolic type resin may be a copolymer of a phenol, resorcinol, a cresol or a xylenol with an aldehyde or with furfural. Thus, it may be a copolymer of phenol or a substituted phenol with formaldehyde or a formaldehyde-yielding material, such as, paraformaldehyde or hexamethylene tetraamine. The phenolic resin is preferably of the oil soluble type. As examples of thermosetting phenolic type resins which may be used may be mentioned copolymers of formaldehyde with p-cresol, p-ethyl phenol, p-tert butyl phenol, p-tert amyl phenol, p-tert octyl phenol, p-phenyl phenol, diisobutyl phenol, or a "bisphenol," such as 4,4-isopropylidene diphenol or 2,2-bis-(p-hydroxy phenyl) propane. It may be of the modified type, such as, for example, one which has been modified with copal or rosin to cause it to be oil soluble.

The phenolic type resins are, themselves, curing agents for the epoxy resins, and even those which are, themselves, permanently fusible form a tough, adherent film in combination with an epoxy resin which is probably the result of a cross-linking between the epoxy resin and the phenolic type resin. However, the resinous compositions may contain an additional curing agent. This curing agent may be another resin, such as, for example, a polyamide resin or a melamine-formaldehyde resin, or it may be, for example, a dibasic acid, such as, for example, phthalic anhydride, an amine, such as, for example, triethanolamine, diethylene triamine or metaphenylene diamine, or an amide, such as, for example, dicyandiamide.

Preferred non-brittle or high-peel strength adhesives for use are neoprene-phenolics, nitrile phenolics, vinyl formalphenolics, vinyl butyral phenolics, nylon phenolics, and modified epoxies, e.g. epoxies formulated by the use of polymeric curing agents, or by alloying with polymeric film-formers, such as polysulfides, nylon, and alkyds.

It should be understood that although ordinarily the resinous carrier for the catalytic agent will comprise thermosetting and a flexible adhesive resin in combination, for special applications, the resinous carrier may be limited to either a thermosetting resin or a flexible adhesive resin.

The catalytic agent, it should be clear, is incorporated into the resinous compositions in such a way that the agent is dispersed throughout the resin, and present in the resin, upon solidification, at numerous individual sites. Because of this dispersion, the particles of the receptive agents are not in contact with one another and accordingly, the catalytic compositions disclosed herein are non-conducting. Of course, when the active agent is itself non-conducting, such as cuprous oxide, or titanous oxide, this factor is not important. When metals such as copper, iron, and so forth, are employed as the catalytic agent, however, the dispersion of the active particles throughout the resin becomes important. Were conducting particles to be incorporated into the catalytic compositions in such a manner that they were in intimate contact with one another, it would be impossible to prepare printed circuits from such compositions using the so-called reverse method. In this method, the catalytic composition would be adhered to the over-all surface of the base material or the base material would itself constitute the catalytic composition, and selected portions thereof would then be masked, leaving exposed the conductor pattern. The base would then be immersed in the electroless copper bath to deposit copper on the exposed areas. Were the catalytic composition employed conductive, leakage would occur between the lines of the conductor pattern through the catalytic composition. Obviously, such a situation could not be tolerated.

When large amounts of the catalytic agent are employed, e.g., 80% by weight based on the resin, relatively small amounts of resin bind the uppermost or surface particles of the active agent. Accordingly, electroless metal can readily deposit on the active agent on the surface. When small amounts of the active agent are employed in comparison to the resin, e.g., 0.25 to 10% by weight, it may be that the active agent at the surface of the catalytic composition will be completely coated by the resinous material. In this situation, it may be necessary to treat the surface as by treatment with solvents, abrasion, and the like, to expose the particles prior to contact with the electroless plating bath. If, in this embodiment no pretreatment to expose the particles is carried out, it will be necessary to expose the surface to the electroless plating bath for several hours before the initial metal deposit will form.

When copper oxide is used, it is preferable to activate the cuprous oxide by treatment with a reducing agent, to convert at least a portion of the cuprous oxide particles at the surface of the ink to copper. Preferred for use as the reducing agent is sulfuric acid. Other reducing agents which are acceptable include aqueous solutions of phosphoric acid, acetic acid, sulfuric acid, hydrofluoric acid, hypophosphites, and the like. Nitric acid may also be used but it is not quite as desirable as the others since it dissolves the copper formed at a rather high rate. Alkaline formaldehyde solutions including the electroless copper baths disclosed herein will also reduce the cuprous oxide.

Among the wide variety of adhesives which may be used when it is desired to prepare the catalytic compositions in the form of inks are those compositions disclosed in U.S. Patent Nos. 2,532,374 and 2,758,953. In this embodiment, the receptive agent, as will be clear, is imparted into the adhesive base in such a way that the receptive agent is dispersed throughout the base medium, and present in the base medium at numerous individual sites.

Typical examples of catalytic inks suitable for use in printing conductor patterns on an insulating base are given below:

*Example 1*

| | G. |
|---|---|
| Xylene | 50 |
| Diacetone alcohol | 75 |
| Parlon, 10 cps. | 50 |
| Phenol-formaldehyde (oil soluble) | 10 |
| Butadiene-acrylonitrile rubber | 20 |
| Cab-O-Sil | 3 |
| Cuprous oxide | 70 |

*Example 2*

| | |
|---|---|
| Butadiene-acrylonitrile rubber | 15.5 |
| Diacetone alcohol | 72 |
| Nitromethane | 72 |
| Phenol-formaldehyde resin (oil soluble) | 7.5 |
| Cab-O-Sil | 4 |
| Ethanol | 3 |
| Parlon, 10 cps. | 10 |
| Xylene | 50 |
| Cuprous oxide | 80 |

*Example 3*

| | |
|---|---|
| Butadiene-acrylonitrile rubber | 15.5 |
| Diacetone alcohol | 50 |
| Nitromethane | 50 |
| Phenol-formaldehyde resin (oil soluble) | 7.5 |
| Parlon, 10 cps. | 3 |
| Toluene | 20 |
| Cab-O-Sil | 3 |
| Ethanol | 3 |
| Cuprous oxide | 60 |

*Example 4*

| | |
|---|---|
| Butadiene-acrylonitrile rubber | 15.5 |
| Diacetone alcohol | 50 |
| Nitromethane | 50 |
| Phenol-formaldehyde resin (oil soluble) | 7.5 |
| Cab-O-Sil | 3 |
| Ethanol | 3 |
| Cuprous oxide | 60 |

*Example 5*

| | |
|---|---|
| Toluene | 50 |
| Diacetone alcohol | 50 |
| Butadiene-acrylonitrile rubber | 10.5 |
| Phenol-formaldehyde resin (oil soluble) | 7.5 |
| Parlon, 10 cps. | 5 |
| Ethanol | 5 |
| Cab-O-Sil | 6 |
| Cuprous oxide | 50 |

*Example 6*

| | |
|---|---|
| Epoxy resin | 15 |
| Butadiene-acrylonitrile rubber | 15 |
| Diacetone alcohol | 50 |
| Toluene | 50 |
| Phenol-formaldehyde resin (oil soluble) | 11 |
| Cuprous oxide | 60 |

In the above examples, Parlon is a chlorinated rubber from Hercules Powder Company. The epoxy resin of Example 6 is DER 332, sold by Dow Chemical Company, and is the reaction product of epichlorohydrin and Bisphenol A. It has an epoxy equivalent of 173 to 179, an average molecular weight of 340 to 350 and a viscosity at 25° C. of 3600 to 6400. Cab-O-Sil is a tradename for a colloidal silica.

To prepare the coating compositions or inks disclosed in Examples 1 to 6, the resins are dissolved in the solvents and milled with the pigments on a three roll mill.

The viscosity of compositions having the formulae of Examples 1 to 6 will ordinarily vary between about 5 and 100 poises at 20° C.

The catalytic inks may be applied to the base on which the circuit is to be formed in any convenient manner. For example, when a direct process for making printed circuits is employed, the circuit pattern of the ink may be imposed on the insulating base by screen printing or offset printing techniques. When the reverse process is employed, the insulating base may be coated with the catalytic ink, as by dipping, spraying, calendering, and the like, and then portions thereof masked to leave exposed the conductor pattern.

After treatment of the panel with the catalytic ink, the adhesive base of the ink may be partially or fully cured by heating, thereby firmly bonding the adhesive ink with its contained receptive agent to the insulating base member. Preferably, the ink will be partially cured before electroless metal deposition and fully cured following deposition.

The insulating base materials or resin masks to be used herein must be able to withstand the temperatures which will be encountered in processing and in use. Suitable materials for use as the insulating base materials or the resin masks are phenol-formaldehyde, melamine-urea, vinyl acetate-chloride copolymer, rubber, epoxy resin polymers, epoxy impregnated fiberglass, acrylonitrile-butadiene-styrene, and the like.

Copper oxide constitutes a preferred catalytic agent for use herein because, by itself, it is an exceptionally good insulator of electricity. When ink or resin containing cuprous oxide is subjected to a reducing agent, such as sulfuric acid, a portion of the cuprous oxide, in contact with the reducing agent, is converted to metallic copper, which in turn serves as the catalytic site for electroless copper deposition. The cuprous oxide which does not contact the reducing agent remains un-reduced, and serves as an effective insulator to prevent leakage between separate circuit layers.

Alternatively, with inks containing cuprous oxide, selective portions of the ink coating can readily be rendered conductive by reducing all of the cuprous oxide therein to copper. This feature of a cuprous oxide containing ink could be taken advantage of in building up the interconnecting portions of the multilayer circuits of this invention.

Typically, the autocatalytic or electroless metal deposition solutions for use in forming the multilayer circuit layers comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time, as will be made more clear hereinbelow.

For ductile deposits, a small effective amount of a cyanide compound should be added to the electroless metal solution.

As the cyanide compound may be mentioned alkali cyanides, such as sodium and potassium cyanide, and nitriles such as chloroacetonitrile, alpha-hydroxy nitriles, e.g., glycolnitrile and lactonitrile.

The amount of cyanide compound will ordinarily range between about 5 micrograms and 500 milligrams per liter.

Care should be employed in adding the cyanide compounds to insure that an excess is not employed. Too much cyanide compound is deleterious and will deactivate the solution.

The reducing agents in typical electroless metal deposition baths include borohydrides, amine boranes, hydrazines, hypophosphites, hydrosulfites, formaldehye, and the like.

The borohydride reducing agent may consist of any water soluble borohydride having a good degree of solubility and stability in aqueous solutions. Sodium and potassium borohydrides are preferred. In addition, substituted borohydrides in which not more than 3 hydrogen atoms of the borohydride ion have been replaced can be utilized. Sodium trimethoxy borohydride, $NaB(OCH_3)_3H$, is illustrative of the compounds of this type.

Also may be mentioned ammonium borohydride and the amine boranes, such as isopropylamine borane and dimethylamine borane.

Among the hydrazines may be mentioned water soluble salts of hydrazine, such as the hydrazine sulfates, e.g., monohydrazine sulfate, dihydrazine sulfate, hydrazine disulfate, and the like. Because of its greater solubility in water, dihydrazine sulfate is preferred.

Among the hypophosphite and hydrosulfite reducing agents, the alkali metal, e.g., sodium, potassium and ammonium, salts are preferred.

In addition to formaldehyde, polymers of the formaldehyde, e.g., paraformaldehyde, may be used as the reducing agent. Also suitable as the reducing agent is alpha-trioxymethylene.

The sequestering or complexing agent will be selected to form a strong complex with the metal ions to prevent the precipitation of metal or metallic salts. The complexing agent selected should also be capable of forming a metal complex which is soluble in the plating solution, and also which is sufficiently stable so that it will not react with the reducing agent in the main body of the plating solution, but only at or in the near vicinity of the catalytic surface.

The complexing or sequestering agents suitable for use in accordance with this invention include ammonia and organic complex-forming agents containing one or more of the following functional groups: primary amino group ($—NH_2$), secondary amino group (>NH), tertiary amino group (>N—), imino group (=NH), carboxy group (—COOH), and hydroxy group (—OH). Among such agents may be mentioned ethylenediamine, diethylenetriamine, triethylenetetramine, ethylenediaminetetraacetic acid, citric acid, tartaric acid, and ammonia. Related polyamines and N-carboxymethyl derivatives thereof may also be used.

Rochelle salts, the sodium salts (mono-, di-, tri-, and tetrasodium) salts of ethylenediaminetetraacetic acid, nitrilotriacetic acid and its alkali salts, gluconic acid, gluconates, and triethanolamine are preferred as complexing agents, but commercially available glucono-lactone and modified ethylenediamineacetates are also useful, and in certain instances give even better results than the pure sodium ethylenediaminetetraacetates. One such material is N-hydroxyethylethylenediaminetriacetate. Other materials suitable for use as complexing agents are disclosed in U.S. Patent Nos. 2,996,408, 2,938,805, 3,075,855 and 3,075,856.

In preparing the electroless metal deposition baths, it is desirable to combine the bath ingredients in such a manner as to avoid reaction between the soluble metal salt and the reducing agent.

The quantities of the various ingredients in the baths of this invention are subject to wide variation. Typically, however, the bath constituents will be as follows:

| | |
|---|---|
| Water soluble metal salt | 0.002 to 0.60 mole/l. |
| Reducing agent | 0.0002 to 2.5 moles/l. |
| Complexing agent | 0.7 to 10 times the moles of metal salt. |
| Cyanide compound | 0.00002 to 0.06 mole/l. |

The amount of sequestering agent to be added to the plating solution depends upon the nature of the sequestering agent and the amount of the metal salt present in the bath. In alkaline solutions, the preferred ratio of the metal salt to complexing agent lies between about 1:1 and 1:10. A small excess of the sequestering agent, based upon the metal salt, generally is advantageous.

It should be understood that as the baths are used up in plating, the metal salt, and the reducing agent may be replenished from time to time, and also that it may be advisable to monitor the pH, and the cyanide content of the bath, and to adjust them to their optimum value as the bath is used.

For best results, surfactants in an amount of less than about 5 grams per liter are added to the baths disclosed herein. Typical of suitable surfactants are organic phosphate esters, and oxyethylated sodium salts. Such surfactants may be obtained under the trade names Cafac RE–610 and Triton QS–15, respectively.

The baths are ordinarily used at temperatures between 25° and 70° C., although they may be used at lower temperatures or at even higher temperatures. As the temperature is increased, it is usual to find that the rate of plating is increased.

With the baths disclosed, metal deposition occurs autocatalytically at a uniform rate wherever there is contact between the catalytic surface being plated and the plating solution. There is no substantial variation in the plate thickness even for the most complicated shapes. Thus, metal may be uniformly deposited in recesses, as well as on exposed parts of the object being plated, and there is no build-up of coating at points or edges. These conditions are difficult or impossible to achieve by electroplating. Because of the uniform deposition achieved, the plating process described is particularly suitable for plating objects of irregular or complicated shapes which are difficult or impossible to metallize by conventional techniques.

Although electroless deposition of such metals as nickel, cobalt, cadmium, tin and the like, is contemplated in forming the printed circuits disclosed herein, the invention will be particularly described with reference to electroless deposition of the Group IB metals, as exemplified by copper.

The copper baths to be described herein will ordinarily deposit a coating of electroless copper of a thickness of about 1 mil, within between about 10 and 100 hours, depending on the composition, pH, temperature, and related factors.

Specific examples of electroless copper depositing baths suitable for use will now be described.

*Example 7*

| | Moles/l. |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C., and will deposit a coating of ductile electroless copper about 1 mil thick in about 51 hours.

Other examples of suitable baths are as follows:

*Example 8*

| | Moles/l. |
|---|---|
| Copper sulfate | 0.02 |
| Sodium hydroxide | 0.05 |
| Sodium cyanide | 0.0002 |
| Trisodium N-hydroxyethylethylenediaminetriacetate | 0.032 |
| Formaldehyde | 0.08 |
| Water | Remainder |

This bath is preferably operated at a temperature of about 56° C., and will deposit a coating of ductile electroless copper about 1 mil thick in about 21 hours.

*Example 9*

| | | |
|---|---|---|
| Copper sulfate | moles/l.. | 0.05 |
| Diethylenetriaminepentaacetate | do.... | 0.05 |
| Sodium borohydride | do.... | 0.009 |
| Sodium cyanide | do.... | 0.008 |
| pH | | 13 |
| Temperature | ° C.. | 25 |

*Example 10*

| | | |
|---|---|---|
| Copper sulfate | moles/l.. | 0.05 |
| N-hydroxyethylethylenediaminetriacetate | do.... | 0.115 |
| Sodium cyanide | do.... | 0.0016 |
| Sodium borohydride | do.... | 0.008 |
| pH | | 13 |
| Temperature | ° C.. | 25 |

As stated above, the initial circuit pattern may be imposed on the insulating substratum by conventional techniques, such as print and etch, or by an additive process, e.g., electroless metal deposition.

When superimposing the first circuit pattern by an additive process, the substrate may first be sensitized for deposition of electroless metal utilizing any of the techniques described hereinabove and electroless metal then deposited utilizing the electroless metal deposition baths of the type described.

Utilizing the electroless metal baths of the type described, very thin conducting circuit patterns may be laid down. Ordinarily the circuit pattern superimposed by electroless metal deposition will range from 0.1 to 7 mils in thickness, with patterns having a thickness of even less than 0.1 mil being possible.

Because of the extreme thinness of the circuit patterns that may be laid down, the multi-circuit assemblies themselves may be made extremely thin, and the techniques described are therefore readily adaptable to mass production of microminiature, as well as standard-size multilayer components.

FIGURE 2A–E illustrates the steps in the manufacture of an embodiment of the invention wherein the first as well as subsequent printed circuit patterns are superimposed on an insulating substratum of an additive process of the type described.

As shown in FIGURE 2A, there is first provided an insulating base 10 provided with apertures 11 defining interconnecting points.

In B, the insulating base including the walls 13 of the aperture 11, are coated with a catalytic ink of the type described.

Figure 2:
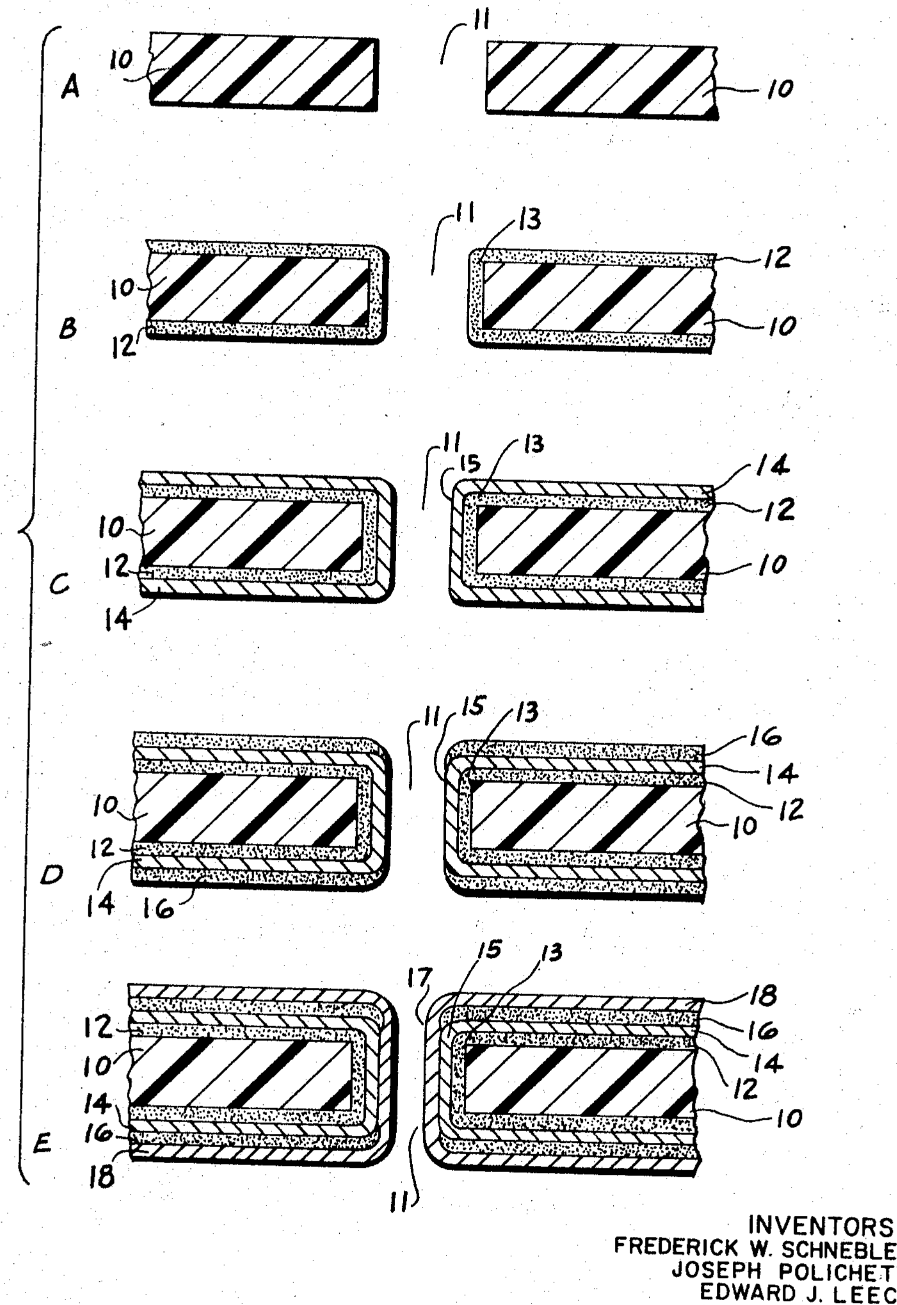

At C, FIGURE 2, a first conducting pattern 14 is adhesively bonded to the catalytic ink 12 by contacting the assembly with an electroless metal deposition solution. The circuit 14 extends through the hole as shown at 15 and covers the surrounding wall of the hole, thereby rendering it conductive.

At D, FIGURE 2, the first electrolessly deposited printed circuit pattern 14 is covered with an insulating catalytic resinous mask 16. The mask 16 as shown in D tapers off into the hole, but leaves the deposit of electroless metal 15 surrounding the hole exposed.

Next, a pattern of a second circuit will be imposed on the insulating catalytic layer 16,, e.g., a negative image of the second circuit could be printed on the catalytic layer 16 using an insulating, non-catalytic ink, thereby leaving the positive image of the second circuit exposed. As shown at E, FIGURE 2, a second circuit pattern 18 is then deposited on the exposed catalytic particles of the layer 16 by contacting the assembly with an electroless metal deposition bath.

As shown in FIGURE 2E, the second conducting pattern 18 extends into the holes as shown at 17. Metal deposit 17 covers and contacts the layer of metal 15 forming a part of the first circuit pattern 14.

There is thus provided a multilayer assembly comprising printed circuit patterns 14 and 18 which are electrically connected by metal deposits 15 and 17. Metal deposits 15 and 17 contact each other as well as circuit patterns 14 and 18, and surround the wall forming aperture 11. Aperture 11 remains open for reception of leads from external circuit components.

In FIGURE 2, catalytic mask 16 could be replaced by a non-catalytic insulating mask. A positive image of circuit 18 could then be printed on the insulating mask using catalytic inks of the type described.

In the embodiment of the invention shown in FIGURE 3, the insulating base or substratum 20 contains finely divided particles of catalytic agent dispersed throughout. The insulating base is then suitably masked and a first circuit pattern 22 electrolessly deposited. The circuit 22 extends through the holes 23 as shown at 21.

Next, an insulating mask 24 containing finely divided particles of a catalytic agent is superimposed on the circuit pattern 22. The insulating catalytic ink 24 extends slightly into the hole, but leaves metal 21 surrounding the hole exposed. Following suitable masking a second circuit pattern 26 is electrolessly deposited. As shown in FIGURE 3, the second circuit pattern 26 extends into the hole as shown at 27. Deposit 27 contacts deposit 21, thereby forming an electrical interconnection between circuits 22 and 26. Hole 23 remains open for reception of leads. Here again, in FIGURE 3, catalytic mask 24 could be replaced by a non-catalytic insulating mask. A positive image of circuit 26 could then be printed on the insulating mask using a catalytic ink of the type described.

Such a modification is shown in FIGURE 4.

In FIGURE 4, the insulating base 30 comprises an insulating resinous material having dispersed therein finely divided particles of a catalytic agent.

The base 30 is provided with apertures 33 defining cross-overs. The base 30 is masked with a non-catalytic resinous material to define a first circuit pattern, and then the assembly is subjected to an electroless metal deposition bath to superimpose a first circuit pattern 32 on the base material, including a layer 31 extending through the holes. The entire circuit pattern 32 is then coated with a non-catalytic insulating mask 34, the mask extending partially into the holes, but leaving the metal layer 31 exposed.

Next, catalytic resinous ink 36 is printed on the mask 34 in the form of a second desired circuit pattern. The catalytic ink 36 extends partially into the holes, but leaves metal layer 31 exposed.

Finally, the assembly is contacted with an electroless metal deposition bath of the type described to form a second circuit pattern 38. The second circuit pattern 38 extends through the holes as shown at 37. Layer 37 contacts layer 31, thereby forming an electrical interconnection between circuits 32 and 38. Here again, hole 33 remains open for reception of leads from external circuit components.

It will readily be apparent that the basic techniques and embodiments developed will readily suggest further embodiments to those skilled in this art.

Utilizing the teachings contained herein, flexible as well as rigid multilayer printed circuit assemblies may be made with through connections between the circuit layers. When flexible circuits are desired, it is especially important that ductile electroless metal be deposited to form the circuit pattern, to insure that the circuit pattern is capable of withstanding the bending, flexing, and/or twisting to which flexible printed circuits are subjected. Copper electroless deposition solutions containing water soluble cyanide compounds are especially suitable for forming ductile electroless metal deposits, as has been indicated above.

A typical process technique for forming the multilayer boards shown for example in FIGURE 1 is as follows:

(1) Drill or punch holes in an insulating substratum where interconnections are desired.

(2) Print a circuit pattern on the surfaces of the panel using the catalytic ink described herein. Care should be used to insure that the walls surrounding the holes are also coated with the catalytic ink.

(3) Immerse the panel in an electroless copper plating bath of the type described herein, to deposit copper on the catalytic sites in the form of the desired printed circuit. Electroless copper will also be plated on walls surrounding the holes, since these holes were catalyzed in step 2.

(4) Next, the board is cleaned, e.g., by immersing for 15 seconds in a solution of one part 28 percent ammonia and one part isopropyl alcohol and then air drying.

(5) The surface of the panel is blank screened with a resin mask and then cured. The resin mask should terminate at about the lip of the hole, thereby leaving the electroless copper deposit on the hole walls exposed.

(6) A pattern of a second desired circuit is printed with the catalytic ink.

(7) The assembly is immersed in an electroless copper plating bath of the type described herein to electrolessly deposit copper on the exposed catalytic sites, and on the walls surrounding the apertures.

(8) Steps 4–7 are repeated to build up as many circuit layers as desired.

(9) If desired, the assembly is post cured to complete the cure of the resin inks and layers utilized.

In the techniques described, connection between the circuit layers is made by overlapping electroless metal, e.g., copper, layers in the hole. Simultaneously, there are produced circuit layers which are insulated from one another.

The invention in its broadest aspects is not limited to the specific steps, methods, compositions and improvements shown and described, but departures may be made therefrom within the scope of the accompanying claims not departing from the principles of the invention and without sacrificing its chief advantages.

What is claimed:

1. A multilayer printed circuit assembly comprising an insulating base provided with at least one hole defining an interconnecting point and open for the reception of component leads; a first printed circuit pattern on said insulating base; said first circuit pattern including a metal layer extending into the hole and tenaciously adhered to the wall surrounding the hole; an insulating mask superimposed on said first circuit pattern and leaving at least a portion of the metal layer extending into the hole exposed; sensitized surface areas in the form of a second circuit pattern on said insulating mask which are catalytic to the reception of electroless metal; an electroless metal tenaciously adhered to said areas and forming a second printed circuit; said second printed circuit including a metal layer of electroless metal extending into the hole and contacting said first layer of metal; said first layer of metal and said second layer of electroless metal forming an electrical connection between the first and second circuit patterns.

2. The multilayer printed circuit assembly of claim 1 wherein the sensitized areas on the insulating mask are in the form of an adhesive resinous ink containing an agent catalytic to the reception of electroless metal.

3. The multilayer assembly of claim 1 wherein the insulating base has dispersed therein an agent catalytic to the reception of electroless metal; and wherein said first printed circuit pattern comprises an electroless metal deposit which is tenaciously adhered to said base material; said insulating base material being coated with a masking material in those areas not covered by the first printed circuit pattern.

4. The multilayer printed circuit assembly of claim 1 wherein said insulating mask comprises an adhesive resinous material having dispersed therein an agent catalytic to the deposition of electroless metal; said insulating layer being coated on its surface with a second resinous mask in those areas not covered by the second printed circuit pattern.

5. The multilayer printed circuit assembly of claim 1 wherein the first printed circuit pattern comprises electroless metal which is tenaciously adhered to surface areas of the insulating substratum which are sensitized to the reception of electroless metal.

6. A metallized multilayer assembly comprising an insulating base provided with at least one hole; a first metal layer adhered to at least one surface of said base and extending into and adhered to the wall surrounding the hole; an insulating layer superimposed on the first metal layer so as to leave at least a portion of the first metal layer extending into the hole exposed; at least a portion of the exposed surface of said insulating layer being catalytic to the reception of electroless metal; and a layer of electroless metal tenaciously adhered to the catalytic surface of said insulating layer and to said exposed portion of the first metal layer, thereby establishing a metallic connection between the first metal layer and the layer of electroless metal.

7. A multilayer printed circuit board comprising an insulating base provided with at least one hole; a first electroless copper layer adhered to at least one surface of said base and extending into and adhered to the wall surrounding the hole; an insulating layer superimposed on the first electroless copper layer so as to leave at least a portion of the first copper layer extending into the hole exposed, at least a portion of the surface of said insulating layer being catalytic to the reception of electroless copper; and a layer of electroless copper tenaciously adhered to the catalytic surface of said insulating layer and to said exposed portion of the first electroless copper layer, thereby establishing a metallic connection between the first electroless copper layer and said layer of electroless copper adhered to said insulating layer.

8. A multilayer printed circuit assembly comprising an insulating base provided with at least one hole defining an interconnecting point and open for the reception of component leads; a first printed circuit pattern on said insulating base; said first circuit pattern including an electroless copper layer extending into the hole and tenaciously adhered to the wall surrounding the hole; an insulating mask superimposed on said first circuit pattern and leaving at least a portion of the first electroless copper layer extending into the hole exposed; sensitized surface areas in the form of a second circuit pattern on said insulating mask which are catalytic to the reception of electroless copper; a second electroless copper layer tenaciously adhered to said sensitized areas and forming a second printed circuit; said second printed circuit including a copper layer of electroless copper extending into the hole and contacting said first layer of electroless copper; said first layer of electroless copper and said second layer of electroless copper forming an electrical connection between the first and second circuit patterns.

9. The multilayer printed circuit assembly of claim 8 wherein the sensitized areas on the insulating mask are in the form of an adhesive resinous ink containing an agent catalytic to the reception of electroless copper.

10. The multilayer printed circuit assembly of claim 8 wherein said insulating mask comprises an adhesive resinous material having dispersed therein an agent catalytic to the deposition of electroless copper, said insulating layer being coated on its surface with a second resinous mask in those areas not covered by the second printed circuit pattern.

References Cited

UNITED STATES PATENTS

| | | | |
|---|---|---|---|
| 3,095,309 | 6/1963 | Zeblinsky et al. ---- | 117—130 X |
| 3,146,125 | 8/1964 | Schnable et al. | |

LEWIS H. MYERS, *Primary Examiner.*

D. L. CLAY, *Assistant Examiner.*